US012732175B2

(12) United States Patent
Hong et al.

(10) Patent No.: US 12,732,175 B2

(45) Date of Patent: Sep. 8, 2026

(54) OUTPUT DETECTION AND PULSE GENERATION CIRCUIT CONTROLLING OPERATION OF LOGIC CIRCUITS INCLUDING SPINTRONIC DEVICES, METHOD THEREOF, AND INTEGRATED CIRCUIT INCLUDING THE SAME

(71) Applicant: UIF (University Industry Foundation), Yonsei University, Seoul (KR)

(72) Inventors: Jongill Hong, Seoul (KR); Taehui Na, Incheon (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 27 days.

(21) Appl. No.: 19/003,152

(22) Filed: Dec. 27, 2024

(65) Prior Publication Data

US 2026/0172013 A1 Jun. 18, 2026

(30) Foreign Application Priority Data

Dec. 13, 2024 (KR) ........................ 10-2024-0185979

(51) Int. Cl.

*H03K 5/135* (2006.01)
*H03K 5/22* (2006.01)
*H03K 19/20* (2006.01)

(52) U.S. Cl.

CPC ............... *H03K 5/135* (2013.01); *H03K 5/22* (2013.01); *H03K 19/20* (2013.01)

(58) Field of Classification Search

CPC ........... H03K 5/135; H03K 5/22; H03K 19/20
USPC ........................................................ 327/141
See application file for complete search history.

(56) References Cited

U.S. PATENT DOCUMENTS 4,985,640 A 1/1991 Grochowski et al.
5,455,540 A * 10/1995 Williams ............... H03L 7/085 331/25

FOREIGN PATENT DOCUMENTS

JP 07014310 A 1/1995
KR 10-2302781 B1 9/2021

* cited by examiner

*Primary Examiner* — Tomi Skibinski

(57) ABSTRACT

An output detection and pulse generation circuit is disclosed. The output detection and pulse generation circuit includes a comparison circuit configured to receive first data to be transmitted to a logic circuit according to a first clock signal and generate a comparison signal by comparing the first data with second data transmitted to the logic circuit in a first phase, and a control signal generation circuit configured to output the comparison signal generated in the first phase as a control signal for controlling activation or deactivation of the logic circuit according to a second clock signal in a second phase.

19 Claims, 4 Drawing Sheets

OUTPUT DETECTION AND PULSE GENERATION CIRCUIT CONTROLLING OPERATION OF LOGIC CIRCUITS INCLUDING SPINTRONIC DEVICES, METHOD THEREOF, AND INTEGRATED CIRCUIT INCLUDING THE SAME

CROSS-REFERENCE TO RELATED APPLICATIONS

This application claims the benefit of Korean Patent Application No. 10-2024-0185979, filed on Dec. 13, 2024, in the Korean Intellectual Property Office, the disclosure of which is incorporated herein in its entirety by reference.

BACKGROUND

The present invention relates to an output detection and pulse generation circuit, and more particularly, to an output detection and pulse generation circuit capable of controlling an operation of a logic circuit including spintronic devices according to a result of comparing data to be transmitted to the logic circuit with data transmitted to the logic circuit, an operating method thereof, and an integrated circuit including the same.

Spin logic devices are next-generation logic devices that utilize the spin of electrons for processing and storing information. While conventional electronic devices use the charge of electrons, spin logic devices use the magnetic properties related to the spin of electrons, so that lower energy consumption and faster operation speeds can be expected.

Electrons have spin, which is a unique quantum property. A direction of the spin (for example, spin up and spin down) can be distinguished as data 0 and data 1, and used as a unit of information.

Spin logic devices are devices that manipulate a spin state of electrons and utilizes it for logic operations. Spin logic devices are energy efficient compared to conventional CMOS transistor-based logic devices.

SUMMARY

An object of the present invention is to provide an output detection and pulse generation circuit capable of controlling an operation of a logic circuit including spintronic devices according to a result of comparing data to be transmitted to the logic circuit with data already transmitted to the logic circuit, an operating method thereof, and an integrated circuit having the same.

An exemplary embodiment of the present invention is directed to an output detection and pulse generation circuit, including a comparison circuit configured to receive first data to be transmitted to a logic circuit according to a first clock signal and generate a comparison signal by comparing the first data with second data transmitted to the logic circuit in a first phase, and a control signal generation circuit configured to output the comparison signal generated in the first phase as a control signal for controlling activation or deactivation of the logic circuit according to a second clock signal in a second phase.

The comparison circuit generates a deactivated comparison signal according to the first clock signal in a third phase, and the control signal generation circuit outputs the deactivated comparison signal generated in the third phase as the control signal for deactivating the logic circuit according to the second clock signal in a fourth phase.

Another exemplary embodiment of the present invention is directed to an integrated circuit, including a first logic circuit that includes first spintronic devices, a second logic circuit that includes second spintronic devices, and an output detection and pulse generation circuit that is connected between an output terminal of the first logic circuit and an input terminal of the second logic circuit, in which the output detection and pulse generation circuit detects first data output from the first logic circuit according to a first clock signal having a second level and a second clock signal having a first level, performs an exclusive logic operation on the detected first data and second data latched in the output detection and pulse generation circuit, and generates a control signal for activating the second logic circuit according to a result of the operation. The exclusive logic operation is an XOR operation or an XNOR operation.

Still another exemplary embodiment of the present invention is directed to an operating method of an output detection and pulse generation circuit, including receiving first data to be transmitted to a logic circuit according to a first clock signal having a second level and a second clock signal having a first level, generating a comparison signal by comparing the first data with second data transmitted to the logic circuit, and outputting the comparison signal as a control signal for controlling activation or deactivation of the logic circuit according to the first clock signal having the second level and a second clock signal having a second level.

The operating method of an output detection and pulse generation circuit further includes generating a deactivated comparison signal according to a first clock signal having a first level and the second clock signal having the second level, and outputting the deactivated comparison signal as the control signal for deactivating the logic circuit according to the first clock signal having the first level and the second clock signal having the first level.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION

Figure 1:
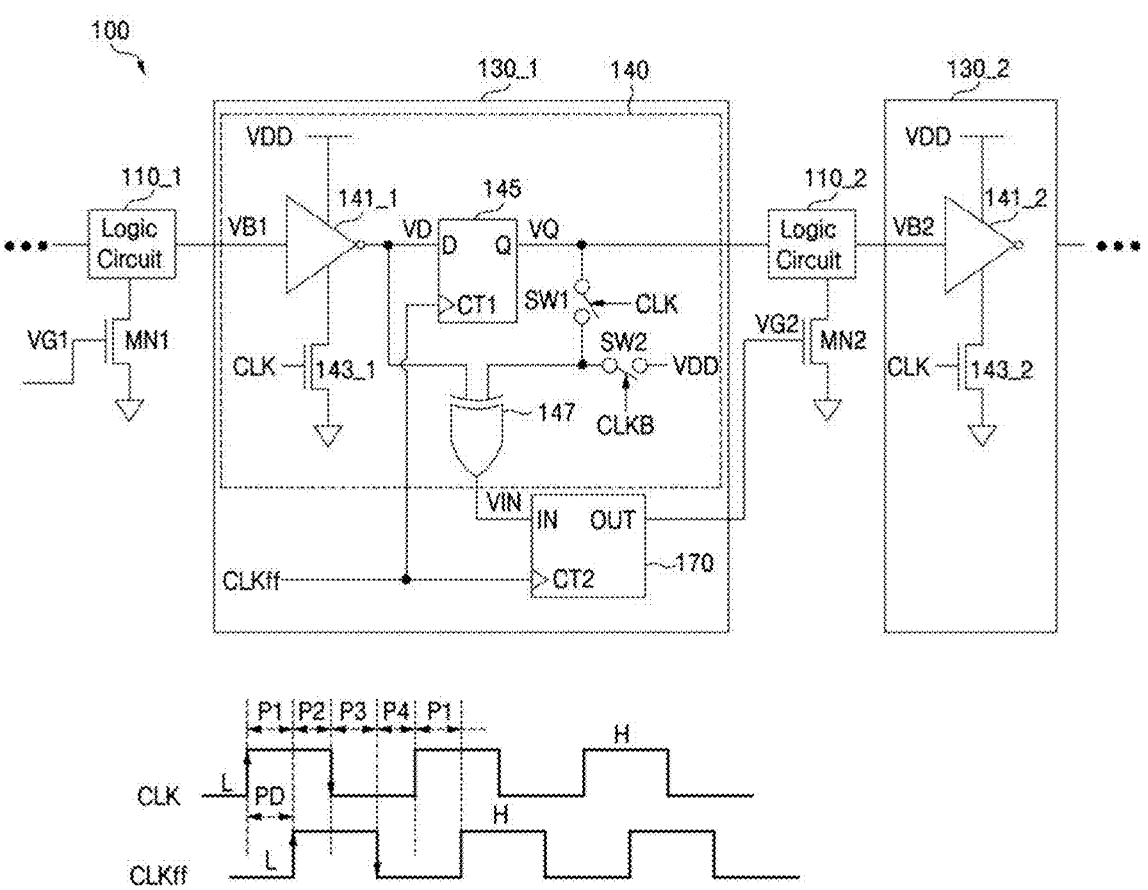
FIG. 1 is a block diagram of a data processing circuit including an output detection and pulse generation circuit according to an embodiment of the present invention.

FIG. 1 is a block diagram of a data processing circuit including an output detection and pulse generation circuit according to an embodiment of the present invention.

Referring to FIG. 1, a data processing circuit (or a digital circuit) 100 that can be implemented as an integrated circuit (IC) includes a plurality of logic circuits 110_1, 110_2, and 110_3 and a plurality of output detection and pulse generation circuits 130_1 and 130_2.

A first output detection and pulse generation circuit 130_1 is connected between an output terminal of a first logic circuit 110_1 and an input terminal of a second logic circuit 110_2, and a second output detection and pulse generation circuit 130_2 is connected between an output terminal of the second logic circuit 110_2 and an input terminal of a third logic circuit 110_3.

Since the output detection and pulse generation circuits 130_1 and 130_2 are the same in structure, a structure and an operation of the first output detection and pulse generation circuit 130_1 will be described.

The first logic circuit 110_1 whose operating state (for example, activation or deactivation) is controlled according to ON or OFF of a first activation control circuit MN1 includes first spintronic devices, the second logic circuit 110_2 whose operating state is controlled according to ON or OFF of a second activation control circuit MN2 includes second spintronic devices, and the third logic circuit 110_3 whose operating state is controlled according to ON or OFF of a third activation control circuit MN3 includes third spintronic devices. Each of the activation control circuits MN1, MN2, and MN3 may be an NMOS transistor, but may be implemented as a PMOS transistor according to an embodiment.

The spintronic elements described in this specification are semiconductor devices based on a technology that simultaneously use spin and charge of electrons to store and process information (or data). Electrons have charge and also have a quantum mechanical characteristic called spin, and spintronics utilizes the spin of electrons as a unit of information. While existing electronic devices process information using a flow of charge, the spintronic devices described in the present invention process information using a spin state of electrons (for example, spin up or spin down).

Spintronic devices (or elements) include spin-transistors, magnetoresistance devices, and/or magnetic memory devices. Spin-transistors are made by combining two magnetic layers (for example, ferromagnetic layers)) and a non-magnetic layer, and control a flow of a current by an alignment of electron spins. Since the flow of a current changes depending on a spin direction of electrons, digital information can be processed using this.

Magnetoresistance devices are devices that use a phenomenon in which resistance in a magnetic material changes as ultraviolet light changes, and examples of the magnetoresistance devices include tunnel magnetoresistance (TMR) devices (for example, MRAM) and giant magnetoresistance (GMR) devices.

Examples of the magnetic memory device include a magnetoresistive random access memory (MRAM), a spin-transfer torque MRAM (STT-MRAM), and a spin-orbit torque magnetoresistive random-access memory (SOT MRAM).

Each of the logic circuits 110_1, 110_2, and 110_3 may include at least one of an inverter, a buffer, a logic gate circuit operating based on Boolean Algebra, a combinational logic circuit, a sequential logic circuit, an arithmetic logic unit (ALU), or a digital clock circuit, which are made using the spintronic devices exemplarily described above, or a combined circuit of these.

The first output detection and pulse generation circuit 130_1 detects first data VD output from the first logic circuit including the first spintronic devices, i.e., a previous logic circuit 110_1, and applies a pulse VG2 to a next logic circuit 110_2 only when the detected first data VD and second data VQ transmitted to the second logic circuit including the second spintronic devices, i.e., the next logic circuit 110_2, are different from each other, thereby driving the next logic circuit 110_2.

At this time, the second data VQ is data latched in the first output detection and pulse generation circuit 130_1, for example, a single-edge triggered flip-flop 145.

Accordingly, power consumption of the next logic circuit 110_2 is minimized, and the first output detection and pulse generation circuit 130_1 operates based on clock signals CLK and CLKff, thereby enabling a stable operation. According to embodiments, frequencies of the clock signals CLK and CLKff may be the same or different from each other. The PD is the phase difference (or delay) between clock signals CLK and CLKff.

The first output detection and pulse generation circuit 130_1 includes a comparison circuit 140 and a control signal generation circuit 170.

Figure 3:
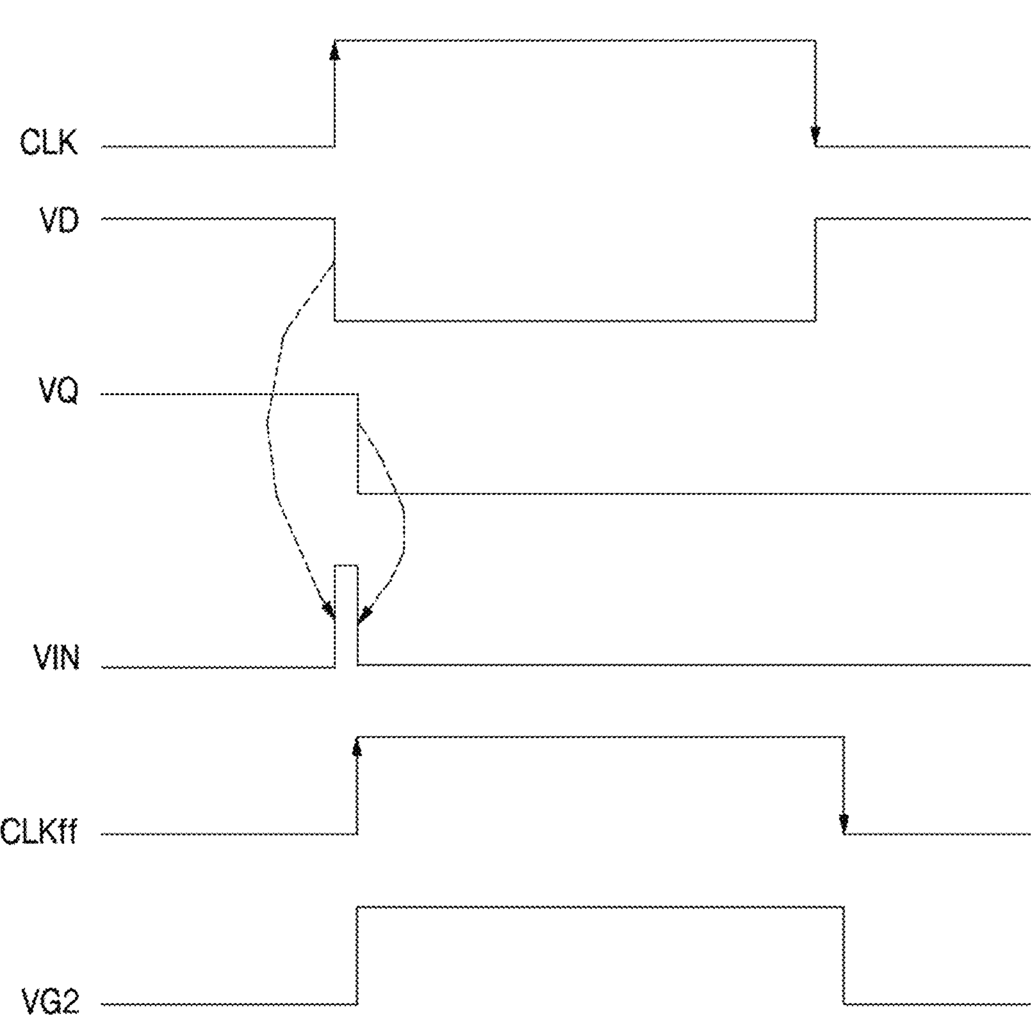
FIG. 3 is a timing diagram for describing an operation of the output detection and pulse generation circuit shown in FIG. 1.

The comparison circuit 140 may receive current input data (also referred to as 'first data') VD to be transmitted to the second logic circuit 110_2 in a first phase P1 defined by a first clock signal CLK having a second level H and a second clock signal CLKff having a first level L, compare the current input data VD with immediately preceding input data (also referred to as 'second data') VQ already transmitted to the second logic circuit 110_2, and generate a comparison signal VIN according to a result of the comparison. As shown in FIG. 3, the comparison signal VIN may be a pulse-shaped signal.

The control signal generation circuit 170 may output the comparison signal VIN as a control signal VG2 for controlling activation (or enabling) or deactivation (or disabling) of the second logic circuit 110_2 in a second phase P2 defined by the first clock signal CLK having the second level H and a second clock signal CLKff having a second level H.

The comparison circuit 140 includes a non-volatile gate circuit 141_1, a control circuit 143_1, a single-edge triggered flip-flop 145, a first switch SW1, a second switch SW2, and a comparator 147.

In the first phase P1, that is, when the first clock signal CLK is at the second level (or a high level) H and the second clock signal CLKff is at the first level (or a low level) L, the control circuit 143_1 activates the non-volatile gate circuit 141_1 in response to the first clock signal CLK having the second level H. In the first phase P1, each of the activation control circuits MN1, MN2, and MN3 is in an off state.

For example, the control circuit 143_1 may be an NMOS transistor, and the non-volatile gate circuit 141_1 is activated to operate normally when the NMOS transistor 143_1 is turned on in response to the first clock signal CLK having the second level H.

The non-volatile gate circuit 141_1 may be a spin inverter 141_1 or a spin buffer including an even number of spin inverters, but the present invention is not limited thereto.

When the activated non-volatile gate circuit 141_1 is the spin inverter 141_1 including spintronic devices, the spin inverter 141_1 receives and inverts input data VB1 generated by the first logic circuit 110_1 to generate the current input data VD, and the spin inverter 141_1, unlike a CMOS inverter, can maintain the current input data VD as it is even when a power of the first output detection and pulse generation circuit 130_1 is turned off.

For example, the spin inverter 141_1 may be a circuit that inverts the spin state of electrons by using a spintronics technology. The spin inverter 141_1 may generate an output signal VD having spin in an opposite direction to a spin direction of the input signal VB1.

When the activated non-volatile gate circuit 141_1 is a spin buffer 141_1 including spintronic devices, the spin buffer 141_1 buffers the input data VB1 generated by the first logic circuit 110_1 to generate the current input data VD, and the spin buffer 141_1, unlike a CMOS buffer, may maintain the current input data VD as it is even when the power of the first output detection and pulse generation circuit 130_1 is turned off.

For example, the spin buffer 141_1 may generate an output signal VD having spin in the same direction as the spin direction of the input signal VB1.

The single-edge triggered flip-flop 145 includes an output terminal Q for outputting the latched immediately preceding input data VQ, an input terminal D for receiving the current input data VD, and a first clock terminal CT1 for receiving the second clock signal CLKff.

In the first phase P1, the single-edge triggered flip-flop 145, for example, a rising edge triggered flip-flop 145, latches the immediately preceding input data VQ when the second clock signal CLKff is at the second level H or at a rising edge. According to the embodiment, the single-edge triggered flip-flop 145 may be replaced with a form that latches the immediately preceding input data VQ at a falling edge.

In the first phase P1, the first switch SW1 is turned on in response to the first clock signal CLK having the second level H, and the second switch SW2 is turned off in response to a first inverted clock signal CLKB having the first level L. In this specification, for the convenience of description, each of the switches SW1 and SW2 is described as an NMOS transistor, but the present invention is not limited thereto. For example, each of the switches SW1 and SW2 can be replaced with a transmission gate.

FIG. 3 is a timing diagram for describing an operation of the output detection and pulse generation circuit shown in FIG. 1. Referring to FIG. 1 and FIG. 3, the comparator 147 receives and compares the current input data VD with the immediately preceding input data VQ to generate a comparison signal VIN.

The comparator 147 may be an exclusive logic operation gate circuit, for example, an XOR (Exclusive OR) gate circuit or an XNOR (Exclusive-NOR) gate circuit.

When the comparator 147 is an XOR gate circuit, the XOR gate circuit 147 may generate an activated comparison signal VIN when the immediately preceding input data VQ and the current input data VD are different from each other, and may generate a deactivated comparison signal VIN when the immediately preceding input data VQ and the current input data VD are the same.

For example, when the comparator 147 is an XNOR gate circuit, the XNOR gate circuit 147 may generate an activated comparison signal VIN when the immediately preceding input data VQ and the current input data VD are the same, and may generate a deactivated comparison signal VIN when the immediately preceding input data VQ and the current input data VD are different from each other.

The activated comparison signal VIN is a signal capable of controlling (for example, turning on) the second activation control circuit MN2 to activate the second logic circuit 110_2, and the deactivated comparison signal VIN is a signal capable of controlling (for example, turning off) the second activation control circuit MN2 to deactivate the second logic circuit 110_2.

In the second phase P2, that is, when the first clock signal CLK is at the second level H and the second clock signal CLKff is at the second level H, the control signal generation circuit 170 outputs the comparison signal VIN as the control signal VG2 for controlling activation or deactivation of the second logic circuit 110_2. In the second phase P2, the rising edge triggered flip-flop 145 latches the current input data VD in response to the rising edge of the second clock signal CLKff transitioning from the first level L to the second level H.

Figure 2:
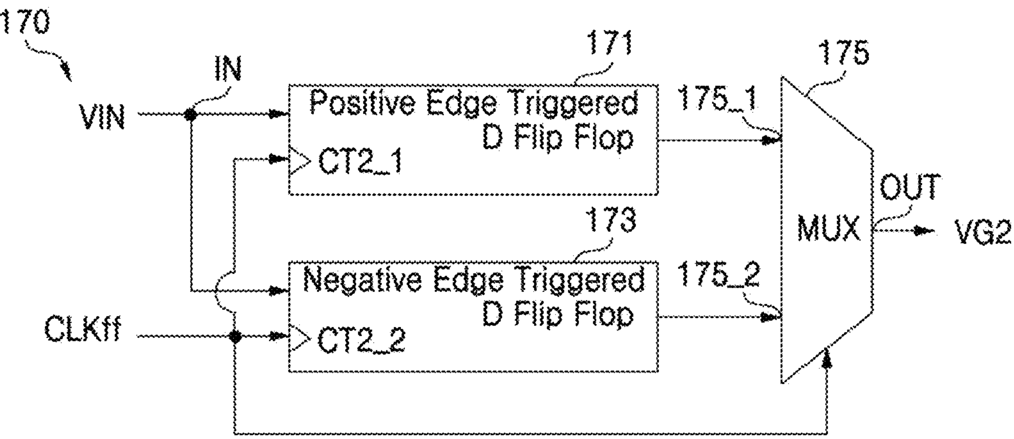
FIG. 2 is a block diagram of a dual-edge triggered flip-flop shown in FIG. 1.

FIG. 2 is a block diagram of the dual-edge triggered flip-flop shown in FIG. 1. Referring to FIGS. 1 and 2, the control signal generation circuit 170 may be a dual-edge triggered flip-flop. The dual-edge triggered flip-flop 170 includes a positive edge (or rising edge) triggered D flip-flop 171, a negative edge (or falling edge) triggered D flip-flop 173, and a multiplexer 175.

The positive edge triggered D flip-flop 171 includes an input terminal IN for receiving the comparison signal VIN, a clock terminal CT2_1 for receiving the second clock signal CLKff, and an output terminal.

The negative edge triggered D flip-flop 173 includes an input terminal IN for receiving the comparison signal VIN, a clock terminal CT2_2 for receiving the second clock signal CLKff, and an output terminal. CT2 in FIG. 2 collectively refers to the clock terminals CT2_1 and CT2_2.

Depending on a level of the second clock signal CLKff, the multiplexer 175 multiplexes an output signal of the positive edge triggered D flip-flop 171 input to a first input terminal 175_1 or an output signal of the negative edge triggered D flip-flop 173 input to a second input terminal 175_3 and outputs a multiplexed signal as the control signal VG2 to the second activation control circuit MN2.

For example, as shown in FIG. 3, when the control signal generation circuit 170 outputs the activated comparison signal VIN generated when the immediately preceding input data VQ and the current input data VD are different from each other, as an activated control signal VG2, to the second activation control circuit MN2, the second activation control circuit MN2 implemented as an NMOS transistor is turned on.

Therefore, the second logic circuit 110_2 activated as the second activation control circuit MN2 is turned on receives and processes output data (VQ=VD) of the first output detection and pulse generation circuit 130_1 and transmits processed data VB2 to the non-volatile gate circuit 141_2 included in the second output detection and pulse generation circuit 130_2. The non-volatile gate circuits 141_1 and 141_2 are the same in structure.

In a third phase P3, that is, when the first clock signal CLK is at the first level L and the second clock signal CLKff is at the second level H, each of the control circuits 143_1 and 143_2 is deactivated, for example, turned off, in response to the first clock signal CLK having the first level L. At this time, each of the activation control circuits MN1, MN2, and MN3 is activated, for example, maintained in an on state, in response to each of control signals VG1, VG2, and VG3. The second output detection and pulse generation circuit 130_2 may generate a control signal VG3 and output it to the third activation control circuit MN3.

As each of the control circuits 143_1 and 143_2 is turned off, each of the non-volatile gate circuits 141_1 and 141_2 is deactivated, and an operating voltage VDD is supplied to an input terminal D of the single-edge triggered flip-flop 145 and a first input terminal of the comparator 147.

In the third phase P3, the first switch SW1 is turned off in response to the first clock signal CLK having the first level L, and the second switch SW2 is turned on in response to the first inverted clock signal CLKB having the second level H, so that the operating voltage VDD is supplied to a second input terminal of the comparator 147 through the second switch SW2 that is turned on.

The XOR gate circuit 147 performs an XOR operation on the operating voltage VDD input to the first input terminal and the operating voltage VDD input to the second input terminal to generate a deactivated comparison signal VIN, which is then transmitted to an input terminal IN of the dual-edge triggered flip-flop 170.

In a fourth phase P4, that is, when the first clock signal CLK is at the first level L and the second clock signal CLKff is at the first level L, each of the control circuits 143_1 and 143_2 is deactivated, for example, maintained in an off state, in response to the first clock signal CLK having the first level L.

In the fourth phase P4, the dual-edge triggered flip-flop 170 outputs the deactivated comparison signal VIN as a control circuit VG2 in response to a falling edge of the second clock signal CLKff.

Accordingly, since the second activation control circuit MN2 is deactivated (i.e., turned off) according to the deactivated control circuit VG2, the second logic circuit 110_2 is deactivated.

Figure 4:
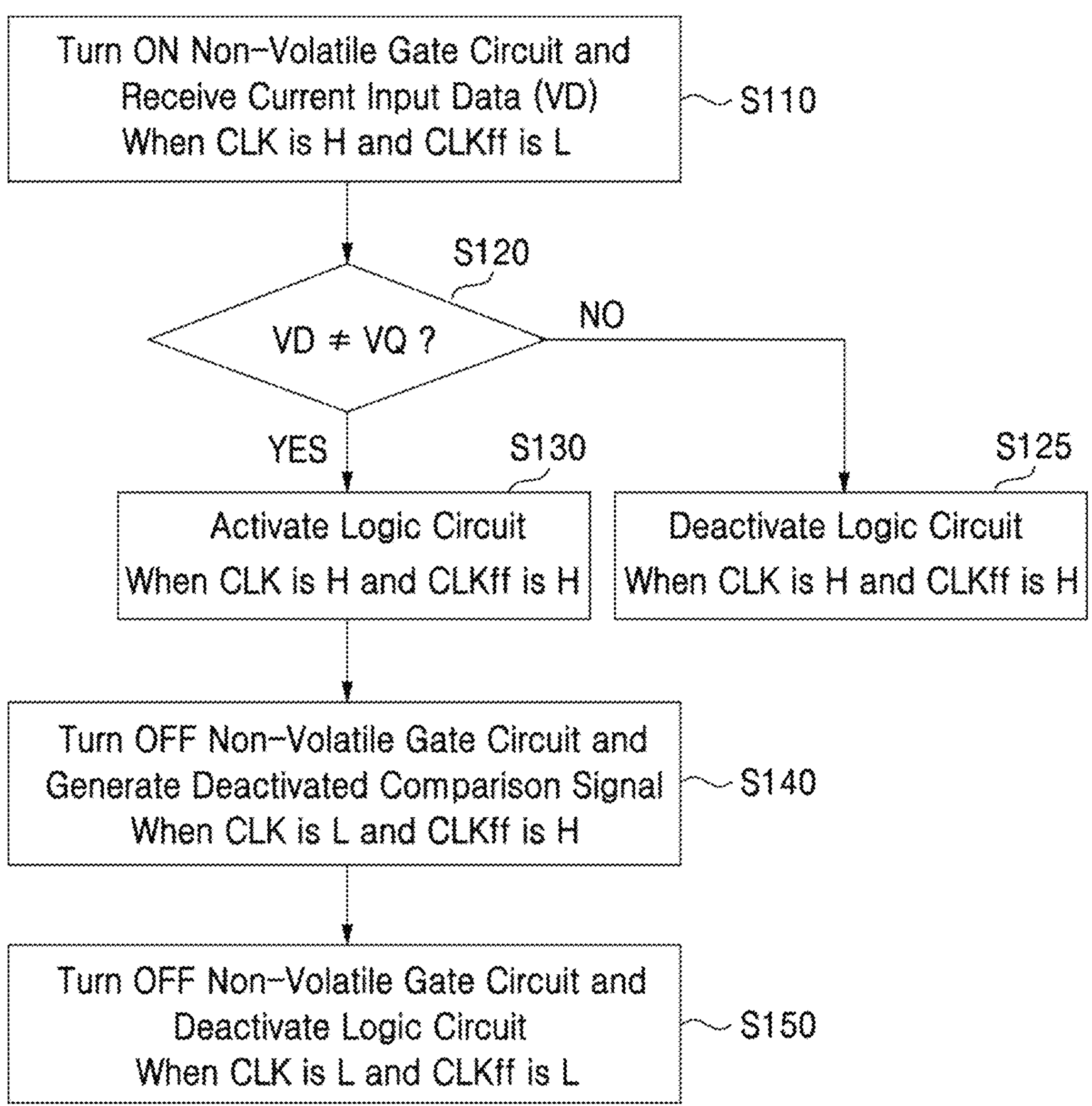
FIG. 4 is a flowchart for describing an operation of the data processing circuit shown in FIG. 1.

FIG. 4 is a flowchart for describing an operation of the data processing circuit shown in FIG. 1. Referring to FIG. 1 to FIG. 4, the first output detection and pulse generation circuit 130_1 receives the current input data VD to be transmitted to the second logic circuit 110_2 according to the first clock signal CLK having the second level H and the second clock signal CLKff having the first level L in the first phase P1 (S110). At this time, the non-volatile gate circuit 141_1 is turned on.

The first output detection and pulse generation circuit 130_1 compares the current input data VD with the immediately preceding input data VQ already transmitted to the second logic circuit 110_2, that is, the immediately preceding input data VQ latched in the first output detection and pulse generation circuit 130_1 (S120).

When the immediately preceding input data VQ and the current input data VD are different from each other (YES in S120), the first output detection and pulse generation circuit 130_1 generates an activated comparison signal VIN.

In the second phase P2, the first output detection and pulse generation circuit 130_1 outputs the activated comparison signal VIN as the control signal VG2. Since the second activation control circuit MN2 is turned on according to the activated control signal VG2, the second logic circuit 110_2 is activated (S130).

However, when the immediately preceding input data VQ and the current input data VD are the same as each other (NO in S120), the first output detection and pulse generation circuit 130_1 generates a deactivated comparison signal VIN.

In the second phase P2, the first output detection and pulse generation circuit 130_1 outputs the deactivated comparison signal VIN as the control signal VG2. Since the second activation control circuit MN2 is turned off according to the deactivated control signal VG2, the second logic circuit 110_2 is deactivated (S125).

In the third phase P3, the first output detection and pulse generation circuit 130_1 generates a deactivated comparison signal VIN (S140).

In the fourth phase P4, the first output detection and pulse generation circuit 130_1 outputs the deactivated control signal VG2 as the control signal VG2. Since the second activation control circuit MN2 is turned off according to the deactivated control signal VG2, the second logic circuit 110_2 is deactivated (S150).

As described with reference to FIGS. 1 to 4, an output detection and pulse generation circuit connected between two logic circuits may detect first data output from a first logic circuit among the two logic circuits, and drive a second logic circuit by applying a pulse corresponding to a control signal to the second logic circuit only when the detected first data and second data transmitted to the second logic circuit among the two logic circuits (i.e., second data latched in the output detection and pulse generation circuit) are different from each other.

However, when an XOR gate circuit included in the output detection and pulse generation circuit is replaced with an XNOR gate circuit, the output detection and pulse generation circuit including the XNOR gate circuit may drive a second logic circuit by applying a pulse corresponding to a control signal to the second logic circuit only when the detected first data and the second data transmitted to the second logic circuit among the two logic circuits (i.e., the second data latched in the output detection and pulse generation circuit) are the same as each other.

The output detection and pulse generation circuit according to an embodiment of the present invention may detect data output from a previous logic circuit and drive a next logic circuit by applying a pulse to the next logic circuit only when the detected data and data transmitted to the next logic circuit are different from each other, thereby minimizing power consumption of the next logic circuit, and enabling a stable operation due to its operation based on clock signals.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An output detection and pulse generation circuit, comprising:

a comparison circuit configured to receive first data to be transmitted to a logic circuit according to a first clock signal and generate a comparison signal by comparing the first data with second data transmitted to the logic circuit in a first phase; and a control signal generation circuit configured to output the comparison signal generated in the first phase as a control signal for controlling activation or deactivation of the logic circuit according to a second clock signal in a second phase, wherein the first clock signal and the second clock signal are in phase with each other during the second phase following the first phase.

2. The output detection and pulse generation circuit of claim 1, wherein the comparison circuit generates a deactivated comparison signal according to the first clock signal in a third phase, and wherein the control signal generation circuit outputs the deactivated comparison signal generated in the third phase as the control signal for deactivating the logic circuit according to the second clock signal in a fourth phase.

3. The output detection and pulse generation circuit of claim 1, wherein the comparison circuit generates an activated comparison signal when the first data and the second data are different from each other, and wherein the control signal generation circuit outputs the activated comparison signal as the control signal for activating the logic circuit.

4. The output detection and pulse generation circuit of claim 3, wherein the comparison circuit generates a deactivated comparison signal when the first data and the second data are the same as each other, wherein the control signal generation circuit outputs the deactivated comparison signal as the control signal for deactivating the logic circuit.

5. The output detection and pulse generation circuit of claim 1, wherein the comparison circuit including:

a non-volatile gate circuit configured to generate the first data by processing input data according to the first clock signal, and maintain the first data even when a power of the output detection and pulse generation circuit is turned off;

a single-edge triggered flip-flop that includes an output terminal for outputting latched second data, an input terminal for receiving the first data, and a first clock terminal for receiving the second clock signal; and a comparator configured to receive and compare the first data with the second data to generate the comparison signal.

6. The output detection and pulse generation circuit of claim 5, wherein the non-volatile gate circuit includes at least one spin inverter, wherein the comparator is an exclusive logic operation gate circuit.

7. The output detection and pulse generation circuit of claim 5, wherein the control signal generation circuit is a dual-edge triggered flip-flop that includes an input terminal for receiving the comparison signal, an output terminal for outputting the control signal, and a second clock terminal for receiving the second clock signal.

8. An integrated circuit comprising:

a first logic circuit that includes first spintronic devices;

a second logic circuit that includes second spintronic devices; and an output detection and pulse generation circuit that is connected between an output terminal of the first logic circuit and an input terminal of the second logic circuit, wherein the output detection and pulse generation circuit detects first data output from the first logic circuit, performs an exclusive logic operation on the detected first data and second data latched in the output detection and pulse generation circuit, and generates a control signal for activating the second logic circuit according to a result of the exclusive logic operation.

9. The integrated circuit of claim 8, wherein the output detection and pulse generation circuit including:

a comparison circuit configured to receive the first data to be transmitted to the second logic circuit according to a first clock signal having a second level and a second clock signal having a first level, and generate a comparison signal by performing the exclusive logic operation on the first data and the second data; and a control signal generation circuit configured to output the comparison signal as the control signal for controlling activation or deactivation of the second logic circuit according to the first clock signal having the second level and a second clock signal having a second level.

10. The integrated circuit of claim 9, wherein the comparison circuit generates a deactivated comparison signal according to a first clock signal having a first level and the second clock signal having the second level, and the control signal generation circuit outputs the deactivated comparison signal as the control signal for deactivating the second logic circuit according to the first clock signal having the first level and the second clock signal having the first level.

11. The integrated circuit of claim 9, wherein the comparison circuit generates an activated comparison signal when the first data and the second data are different from each other, and wherein the control signal generation circuit outputs the activated comparison signal as the control signal for activating the second logic circuit.

12. The integrated circuit of claim 11, wherein the comparison circuit generates a deactivated comparison signal when the first data and the second data are the same as each other, wherein the control signal generation circuit outputs the deactivated comparison signal as the control signal for deactivating the second logic circuit.

13. The integrated circuit of claim 9, wherein the comparison circuit including:

a non-volatile gate circuit configured to generate the first data by processing input data according to the first clock signal having the second level, and maintain the first data even when a power of the output detection and pulse generation circuit is turned off;

a single-edge triggered flip-flop that includes an output terminal for outputting latched second data, an input terminal for receiving the first data, and a first clock terminal for receiving the second clock signal; and a comparator configured to receive and compare the first data with the second data, and generate the comparison signal.

14. The integrated circuit of claim 13, wherein the non-volatile gate circuit is enabled according to the first clock signal having the second level, disabled according to the first clock signal having the first level, and includes at least one spin inverter, and wherein the comparator is an exclusive logic operation gate circuit.

15. The integrated circuit of claim 13, wherein the control signal generation circuit is a dual-edge triggered flip-flop that includes an input terminal for receiving the comparison signal, an output terminal for outputting the control signal, and a second clock terminal for receiving the second clock signal.

16. The integrated circuit of claim 8, wherein the exclusive logic operation is an XOR operation or an XNOR operation.

17. An operating method of an output detection and pulse generation circuit comprising:

receiving first data to be transmitted to a logic circuit according to a first clock signal having a second level and a second clock signal having a first level;

generating a comparison signal by comparing the first data with second data latched in the output detection and pulse generation circuit; and outputting the comparison signal as a control signal for controlling activation or deactivation of the logic circuit according to the first clock signal having the second level and a second clock signal having a second level, wherein the first clock signal and the second clock signal are in phase with each other.

18. The operating method of claim 17, wherein the generating a comparison signal including:

generating an activated comparison signal when the first data and the second data are different from each other, and generating a deactivated comparison signal when the first data and the second data are the same as each other.

19. The operating method of claim 18, further comprising:

generating a deactivated comparison signal according to a first clock signal having a first level and the second clock signal having the second level; and outputting the deactivated comparison signal as the control signal for deactivating the logic circuit according to the first clock signal having the first level and the second clock signal having the first level.

* * * * *